(12) United States Patent
Weng et al.

(10) Patent No.: US 8,222,905 B2
(45) Date of Patent: Jul. 17, 2012

(54) DETERMINATION OF FIELD DISTRIBUTION

(75) Inventors: Zengbo Weng, Singapore (SG); Boris Lukiyanchuk, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 328 days.

(21) Appl. No.: 12/095,100

(22) PCT Filed: Nov. 25, 2005

(86) PCT No.: PCT/SG2005/000403
§ 371 (c)(1),
(2), (4) Date: May 27, 2008

(87) PCT Pub. No.: WO2007/061383
PCT Pub. Date: May 31, 2007

(65) Prior Publication Data
US 2008/0284446 A1    Nov. 20, 2008

(51) Int. Cl.
*G01R 29/12* (2006.01)
(52) U.S. Cl. .................................................. 324/457
(58) Field of Classification Search .................. 324/457, 324/463, 751–753, 750
See application file for complete search history.

(56) References Cited

U.S. PATENT DOCUMENTS

| | | | | |
|---|---|---|---|---|
| 4,898,471 A | * | 2/1990 | Vaught et al. | 356/394 |
| 5,317,380 A | * | 5/1994 | Allemand | 356/338 |
| 6,707,544 B1 | * | 3/2004 | Hunter et al. | 356/237.5 |

OTHER PUBLICATIONS

Wriedt et al. "Light scattering from a particle on or near a surface", Optics Communications 152 (1998) 376-384.*
P. A Bobbert, J. Vlieger, Light scattering by a sphere on a substrate, Physica A: Statistical and Theoretical Physics, vol. 137, Issues 1-2, Jul.-Aug. 1986, pp. 209-242.*
T. Wriedt, A. Doicu, "T-Matrix Method for Light Scattering From a Particle on or Near an Infinite Surface", Lectures of the Summer School of Laredo, University of Cantabria, Spain, Sep. 11-13, 1998, Lecture Notes in Physics, vol. 534, eds. Moreno, Gonzales, Springer 2000, p. 113-132.
T. Wriedt, A. Doicu, "Light Scattering From a Particle on or Near a Surface", Optics Communications 152 (1998) 376-384.
T. Germer, "Scattering by Slightly Non-Spherical Particles on Surfaces", 7th Conference on Electromagnetic and Light Scattering by Nonspherical Particles, Sep. 8-12, 2003, Bremen, Germany, Ed: T. Wriedt, p. 93-96.
Leung Tsang et al., "Scattering of Electromagnetic Waves—Theories and Applications", New York, Wiley, 2000.
Van de Hulst, H. C, "Light Scattering by Small Particles", New York, Wiley, 1957.

* cited by examiner

*Primary Examiner* — Timothy J Dole
(74) *Attorney, Agent, or Firm* — Blank Rome LLP

(57) ABSTRACT

A method for determining field intensity for a particle on a substrate, the method comprising providing an incident wave, determining an electric vector of the field and a magnetic vector of the field inside and outside of the particle, and determining additional scattered fields inside and outside of the particle due to reflection of the incident wave from the substrate.

21 Claims, 10 Drawing Sheets

DETERMINATION OF FIELD DISTRIBUTION

FIELD OF THE INVENTION

This invention relates to the determination of field distribution and refers particularly, though not exclusively, to a method for the determination of field distribution inside and outside a particle, particularly with a spherical particle on surface.

BACKGROUND OF THE INVENTION

Laser-induced near-field patterning of surface at a resolution far below the diffraction limit has attracted more and more attention in recent years due to its extensive potential applications in high-density storage and high-resolution optical lithography for nanodevice fabrication. In most near-field techniques, the subwavelength resolution is achieve by placing a small aperture between the recording medium and light source. If the aperture-to-medium separation is controlled at a distance much smaller than the wavelength, the resolution will be determined by the aperture size instead of the diffraction limit. This technique is used in the scanning near-field optical microscope (SNOM) system; a single hollow optical fiber with a small aperture at its end is used to deliver the laser beam.

Due to the near-field optical enhancement effect at the tip, the SNOM system is able to perform surface modification in a nanoscale of different kinds of materials. However, this approach is difficult to implement in an industrial application due to sophisticated hardware to control the near-field distance and low throughout.

Another approach utilizes a particle mask to pattern a solid substrate. The technique employs a regular two-dimensional (2D) array of microspheres/nanospheres to focus the incident laser radiation onto the substrate. It permits single step surface patterning of thousands or millions submicron holes on the substrate with a single or a few laser shots. The energy conversion efficiency by particle microlens/nanolens is close to 100%, which is significantly higher than that in the SNOM system ($10^{-4}$-$10^{-5}$). However, such systems use normal incidence where the laser beam path is perpendicular to the sample surface. The produced nanostructures are formed at positions where spheres were originally located.

The difference between the nanostructures produced by a normal incidence wave and an angular incidence wave is important as that may allow the production of different nanostructures, and to control the nanostructure propositions. Since the intensity of the filed distribution is responsible for the formation of nanostructures, exact examination of field distributions is very important.

The limitation of the majority of previous systems used for determining the intensity of the filed distribution is the use of conventional Mie theory for theoretical modeling, and thus the influence of the substrate on the filed distribution is neglected.

SUMMARY OF THE INVENTION

In accordance with a first preferred aspect there is provided a method for determining field intensity for a particle on a substrate, the method comprising:
(a) providing an incident wave;
(b) determining an electric vector of the field and a magnetic vector of the field inside and outside of the particle; and
(d) determining additional scattered fields inside and outside of the particle due to reflection of the incident wave from the substrate.

The method may further comprise determining a wave vector of radiation in the particle, transforming spherical harmonics, and or determining extinction absorption and scattering. Extinction absorption may comprise integral characteristics caused by far-field scattering.

The method may further comprise taking into account Fresnel reflection coefficients for parallel and perpendicular polarization. The field may be at least one of an electromagnetic field, and electric field and a magnetic field. The incident wave may be a laser beam.

The total field distribution may be obtained by constructing the total Debye potential fields. The field distribution may be at least one of: electric field distribution, magnetic field distribution, Poynting vector field distribution, and other electromagnetic field quantities which can derived from the electric vector field and the magnetic vector field.

According to a second preferred aspect there is provided a method for fast determination of field distribution for a particle on a substrate, the method comprising:
(a) transformation of scattered field formulation WS;
(b) constructing total Debye potential field; and
(c) determining the field distribution.

The transformation of scattered field transformation may remove a matrix inversion operation in determining a Weyl-type reflection matrix. The transformation of scattered field may reduce field summation orders and may improve field convergence.

The total Debye potential may be a scalar potential by summing the Debye potentials of incident, scattered and reflection fields. The field distributions may be vector fields that can be determined from Debye potentials.

BRIEF DESCRIPTION OF THE DRAWINGS

In order that the present invention may be fully understood and readily put into practical effect, there shall now be described by way of non-limitative example only preferred embodiments of the present invention, the description being with reference to the accompanying illustrative drawings.

In the drawings.

DETAILED DESCRIPTION OF THE PREFERRED EMBODIMENTS

Figure 1:
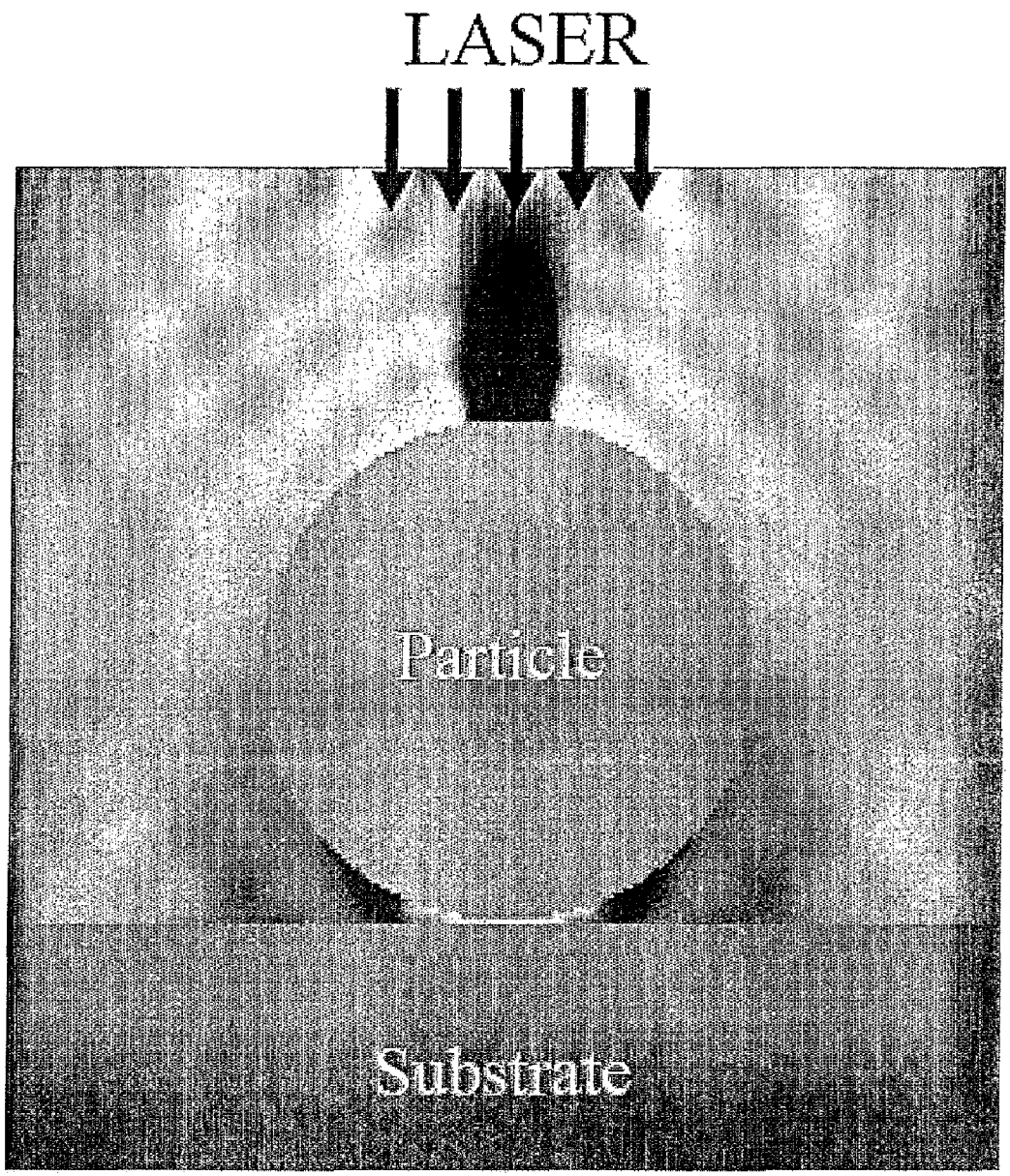
FIG. 1 is an illustration of an intensity distribution.

The method is to determine the distribution of fields and Poynting vector according to Particle on Surface theory. The method takes into account the secondary scattering of radiation reflected from the substrate, as is shown in FIG. 1.

The intensity distribution (z-component of the Poynting vector) is within the x-z plane for radiation with $\lambda=248$ nm, scattered by polystyrene particle (n=1.6, a=0.5 µm) on Si surface. Gradations of the intensity are given from negative (dark) to positive (light) values. The dark area on the top of the particle corresponds to energy flux directed up, while the white area under the particle corresponds to energy flux directed to the substrate.

Many peculiarities of the scattering process can be understood on the basis of the Mie theory, where the particle is considered as a sphere.

The amplitude of the electric vector of the incident plane wave is normalized to unity, and the wave propagates along the z-coordinate (positive direction), the electric vector E is directed along the x-coordinate, and the magnetic vector H along the y-coordinate. In the spherical coordinate system $\{r, \theta, \phi\}$ with the origin situated at the sphere center, this plane wave can be expressed as:

$$E_r = e^{ik_m r \cos\theta} \sin\theta \cos\phi, H_r = \sqrt{\epsilon_m} e^{ik_m r \cos\theta} \sin\theta \sin\phi,$$

$$E_\theta = e^{ik_m r \cos\theta} \cos\theta \cos\phi, H_\theta = \sqrt{\epsilon_m} e^{ik_m r \cos\theta} \cos\theta \sin\phi,$$

$$E_\phi = -e^{ik_m r \cos\theta} \sin\phi, H_\phi = \sqrt{\epsilon_m} e^{ik_m r \cos\theta} \cos\phi. \quad (1)$$

Here $\epsilon_m$ is a complex dielectric permittivity of media, $\sqrt{\epsilon_m} = n_m + i\kappa_m$. The wave vector of radiation in the media is indicated by $k_m = 2\pi\sqrt{\epsilon_m}/\lambda$, where $\lambda$ is the wavelength of radiation. In a similar way we shall indicate the corresponding values for the particle as $\sqrt{\epsilon_p} = n_p + i\kappa_p$ and $k_p = 2\pi\sqrt{\epsilon_p}/\lambda$. The wave vector for a vacuum is indicated by $k_o = 2\pi/\lambda$.

In terms of spherical waves the fields (1) are expressed as following (index "i" indicates the incident wave):

$$E_r^{(i)} = \frac{\cos\varphi}{(k_m r)^2} \sum_{l=1}^{\infty} i^{l-1}(2l+1)\psi_l(k_m r) P_l^{(1)}(\cos\theta), \quad (2)$$

$$E_\theta^{(i)} = -\frac{\cos\varphi}{k_m r}$$

$$\sum_{l=1}^{\infty} i^{l-1} \frac{2l+1}{l(l+1)} \left[ \psi_l'(k_m r) P_l^{(1)'}(\cos\theta)\sin\theta - i\psi_l(k_m r) \frac{P_l^{(1)}(\cos\theta)}{\sin\theta} \right],$$

$$E_\varphi^{(i)} = -\frac{\sin\varphi}{k_m r}$$

$$\sum_{l=1}^{\infty} i^{l-1} \frac{2l+1}{l(l+1)} \left[ \psi_l'(k_m r) \frac{P_l^{(1)}(\cos\theta)}{\sin\theta} - i\psi_l(k_m r) P_l^{(1)'}(\cos\theta)\sin\theta \right],$$

$$H_r^{(i)} = \frac{\sqrt{\epsilon_m} \sin\varphi}{(k_m r)^2} \sum_{l=1}^{\infty} i^{l-1}(2l+1)\psi_l(k_m r) P_l^{(1)}(\cos\theta),$$

$$H_\theta^{(i)} = i\frac{\sin\varphi}{k_0 r}$$

$$\sum_{l=1}^{\infty} i^{l-1} \frac{2l+1}{l(l+1)} \left[ \psi_l(k_m r) \frac{P_l^{(1)}(\cos\theta)}{\sin\theta} + i\psi_l'(k_m r) P_l^{(1)'}(\cos\theta)\sin\theta \right],$$

$$H_\varphi^{(i)} = -i\frac{\cos\varphi}{k_0 r}$$

$$\sum_{l=1}^{\infty} i^{l-1} \frac{2l+1}{l(l+1)} \left[ \psi_l(k_m r) P_l^{(1)'}(\cos\theta)\sin\theta + i\psi_l'(k_m r) \frac{P_l^{(1)}(\cos\theta)}{\sin\theta} \right],$$

where the radial dependence is expressed through the Bessel function (regular at $\rho=0$) and prime indicates differentiation $$\psi_l(\rho) = \sqrt{\frac{\pi\rho}{2}} J_{l+\frac{1}{2}}(\rho), \psi_l'(\rho) = \frac{\partial\psi_l(\rho)}{\partial\rho}. \quad (3)$$

The angular dependence in (2) is related to spherical functions, where $P_n^{(m)}(x)$ are associated Legendre polynomials. The cutting of sums in (2) by value $1 \leq l_{max}$ with recommended values being $l_{max} \approx q + 4q^{1/3} + 1$, where q is the corresponding size parameter. The scattered field for the non-magnetic particle ($\mu=1$) immersed in vacuum is presented by (index "s" stands for indication of the scattered wave):

$$E_r^{(s)} = \frac{\cos\varphi}{(k_m r)^2} \sum_{l=1}^{\infty} l(l+1)\, ^e B_l \zeta_l(k_m r) P_l^{(1)}(\cos\theta), \quad (4)$$

$$E_\theta^{(s)} =$$

$$-\frac{\cos\varphi}{k_m r} \sum_{l=1}^{\infty} \left[ {}^e B_l \zeta_l'(k_m r) P_l^{(1)'}(\cos\theta)\sin\theta - i\, ^m B_l \zeta_l(k_m r) \frac{P_l^{(1)}(\cos\theta)}{\sin\theta} \right],$$

$$E_\varphi^{(s)} = -\frac{\sin\varphi}{k_m r}$$

$$\sum_{l=1}^{\infty} \left[ {}^e B_l \zeta_l'(k_m r) \frac{P_l^{(1)}(\cos\theta)}{\sin\theta} - i\, ^m B_l \zeta_l(k_m r) P_l^{(1)'}(\cos\theta)\sin\theta \right],$$

$$H_r^{(s)} = \frac{\sqrt{\epsilon_m} \sin\varphi}{k_0 r} \sum_{l=1}^{\infty} l(l+1)\, ^m B_l \zeta_l(k_m r) P_l^{(1)}(\cos\theta),$$

$$H_\theta^{(s)} =$$

$$i\frac{\sin\varphi}{k_0 r} \sum_{l=1}^{\infty} \left[ {}^e B_l \zeta_l(k_m r) \frac{P_l^{(1)}(\cos\theta)}{\sin\theta} + i\, ^m B_l \zeta_l'(k_m r) P_l^{(1)'}(\cos\theta)\sin\theta \right],$$

$$H_\varphi^{(s)} = -i\frac{\cos\varphi}{k_0 r}$$

$$\sum_{l=1}^{\infty} \left[ {}^e B_l \zeta_l(k_m r) P_l^{(1)'}(\cos\theta)\sin\theta + i\, ^m B_l \zeta_l'(k_m r) \frac{P_l^{(1)}(\cos\theta)}{\sin\theta} \right],$$

where $$\zeta_l(\rho) = \rho h_l^{(1)}(\rho), \zeta_l'(\rho) = \frac{\partial\zeta_l(\rho)}{\partial\rho}. \quad (5)$$

Here $h_l^{(1)}$ is related to the Hankel function, i.e. the Bessel function of the third kind, which vanished at infinity $$h_l^{(1)}(\rho) = H_{l+\frac{1}{2}}^{(1)}(\rho) = J_{l+\frac{1}{2}}(\rho) + iN_{l+\frac{1}{2}}(\rho), \quad (6)$$

where $N_l(\rho)$ is the Neumann function (designation $Y_l(\rho)$ is used in some books for this function).

Coefficients ${}^e B_l$ and ${}^m B_l$ in formulae (4) are given by $$^e B_l = i^{l+1} \frac{2l+1}{l(l+1)} a_l, \, ^m B_l = i^{l+1} \frac{2l+1}{l(l+1)} b_l, \quad (7)$$

where $a_l$ and $b_l$ are defined as $$a_l = \frac{q_p \psi_l'(q_m)\psi_l(q_p) - q_m \psi_l(q_m)\psi_l'(q_p)}{q_p \zeta_l'(q_m)\psi_l(q_p) - q_m \psi_l'(q_p)\zeta_l(q_m)}, q_m = k_m a, \quad (8)$$

-continued $$b_l = \frac{q_p \psi_l'(q_p)\psi_l(q_m) - q_m \psi_l(q_p)\psi_l'(q_m)}{q_p \psi_l'(q_p)\zeta_l(q_m) - q_m \psi_l(q_p)\zeta_l'(q_m)}, \quad q_p = k_p a.$$

The internal fields (indicated by index "a") inside the particle are given by $$E_r^{(a)} = \frac{\cos\varphi}{(k_p r)^2} \sum_{l=1}^{\infty} l(l+1) \, ^eA_l \psi_l(k_p r) P_l^{(1)}(\cos\theta), \quad (9)$$

$$E_\theta^{(a)} = -\frac{\cos\varphi}{k_p r} \sum_{l=1}^{\infty} \left[ ^eA_l \psi_l'(k_p r) P_l^{(1)\prime}(\cos\theta)\sin\theta - i\,^mA_l \psi_l(k_p r) \frac{P_l^{(1)}(\cos\theta)}{\sin\theta} \right],$$

$$E_\varphi^{(a)} = -\frac{\sin\varphi}{k_p r} \sum_{l=1}^{\infty} \left[ ^eA_l \psi_l'(k_p r) \frac{P_l^{(1)}(\cos\theta)}{\sin\theta} - i\,^mA_l \psi_l(k_p r) P_l^{(1)\prime}(\cos\theta)\sin\theta \right],$$

$$H_r^{(a)} = \frac{\sqrt{\varepsilon_p} \sin\varphi}{(k_p r)^2} \sum_{l=1}^{\infty} l(l+1) \,^mA_l \psi_l(k_p r) P_l^{(1)}(\cos\theta),$$

$$H_\theta^{(a)} = i\frac{\sin\varphi}{k_0 r} \sum_{l=1}^{\infty} \left[ ^eA_l \psi_l(k_p r) \frac{P_l^{(1)}(\cos\theta)}{\sin\theta} + i\,^mA_l \psi_l'(k_p r) P_l^{(1)\prime}(\cos\theta)\sin\theta \right],$$

$$H_\varphi^{(a)} = -i\frac{\cos\varphi}{k_0 r} \sum_{l=1}^{\infty} \left[ ^eA_l \psi_l(k_p r) P_l^{(1)\prime}(\cos\theta)\sin\theta + i\,^mA_l \psi_l'(k_p r) \frac{P_l^{(1)}(\cos\theta)}{\sin\theta} \right].$$

Coefficients $^eA_l$ and $^mA_l$ in formulae (9) are given by $$^eA_l = i^{l+1}\frac{2l+1}{l(l+1)}c_l, \quad ^mA_l = i^{l+1}\frac{2l+1}{l(l+1)}d_l, \quad (10)$$

where $c_l$ and $d_l$ are defined as $$c_l = -\frac{q_p[\zeta_l'(q_m)\psi_l(q_m) - \zeta_l(q_m)\psi_l'(q_m)]}{q_p\zeta_l'(q_m)\psi_l(q_p) - q_m\psi_l'(q_p)\zeta_l(q_m)}, \quad (11)$$

$$d_l = \frac{q_p[\zeta_l'(q_m)\psi_l(q_m) - \zeta_l(q_m)\psi_l'(q_m)]}{q_p\psi_l'(q_p)\zeta_l(q_m) - q_m\psi_l(q_p)\zeta_l'(q_m)}.$$

The time-averaged Poynting vector gives the power per unit of area carried by the wave.

$$S = \frac{1}{2}\text{Re}\{E \times H^*\}. \quad (12)$$

The z-component of this vector for the plane wave (1) is given by $S_z = \langle \cos^2 \omega t \rangle = \frac{1}{2}$. This value characterizing the homogeneous light intensity falls normally to $\{x, y\}$ plane. The light intensity is defined as $$I = E \cdot E^* \equiv |E|^2. \quad (13)$$

Definitions $I=S_z$ and $I=|E^2|$ yield the same time-averaged value for a purely transversal electromagnetic wave, e.g. for the plane wave (1). For the near-field region (with the longitudinal field components) these two intensities are different.

The extinction, absorption and scattering cross sections are given by $\sigma_{ext}=\pi a^2 Q_{ext}$, $\sigma_{abs}=\pi a^2 Q_{abs}$, $\sigma_{sca}=\pi a^2 Q_{sca}$, where related efficiencies Q for polarized and non-polarized light are presented by:

$$Q_{ext} = \frac{2}{q^2}\sum_{l=1}^{\infty}(2l+1)\text{Re}(a_l + b_l), \quad (14)$$

$$Q_{sca} = \frac{2}{q^2}\sum_{l=1}^{\infty}(2l+1)\{|a_l|^2 + |b_l|^2\},$$

$$\overline{\cos\theta} \cdot Q_{sca} = \frac{4}{q^2}\sum_{l=1}^{\infty}\frac{l(l+1)}{l+1}\text{Re}(a_l a_{l+1}^* + b_l b_{l+1}^*) + \frac{4}{q^2}\sum_{l=1}^{\infty}\frac{2l+1}{l(l+1)}\text{Re}(a_l b_l^*),$$

$$Q_{abs} = Q_{ext} - Q_{sca}, \quad Q_{pr} = Q_{ext} - \overline{\cos\theta} \cdot Q_{sca},$$

where the star indicates a complex conjugation, and the size parameter is given by $q=k_0 a=2\pi a/\lambda$. $Q_{pr}$ describes the effects of radiation pressure (van de Hulst, 1981).

The extinction is the integral characteristic caused by far-field scattering. This scattering diagram in x-y plane is given by modes:

$$I_\parallel^{(far)} = \left(\frac{\lambda}{2\pi r}\right)^2 \left| \sum_{l=1}^{\infty}(-i)^l \left[ ^eB_l P_l^{(1)\prime}(\cos\theta)\sin\theta - ^mB_l\frac{P_l^{(1)}(\cos\theta)}{\sin\theta} \right] \right|^2, \quad (15)$$

$$I_\perp^{(far)} = \left(\frac{\lambda}{2\pi r}\right)^2 \left| \sum_{l=1}^{\infty}(-i)^l \left[ ^eB_l \frac{P_l^{(1)}(\cos\theta)}{\sin\theta} - ^mB_l P_l^{(1)\prime}(\cos\theta)\sin\theta \right] \right|^2.$$

The method obtains three components of electric and magnetic vectors at any point inside or outside the particle. Also three components of the time averaged Poynting vectors are obtained. All vector components in Cartesian or spherical coordinate systems can be obtained. Four different scalar values are used for graphical presentations: modules of electric and magnetic fields $|E|^2=E \cdot E^*$ and $|H|^2=H \cdot H^*$. Other two scalars present the module of Poynting vector $|S|$ and z-component of the Poynting vector $S_z$. Distributions of these values in the form of 1D or 2D plots and also contour plots can be obtained.

Figure 2:
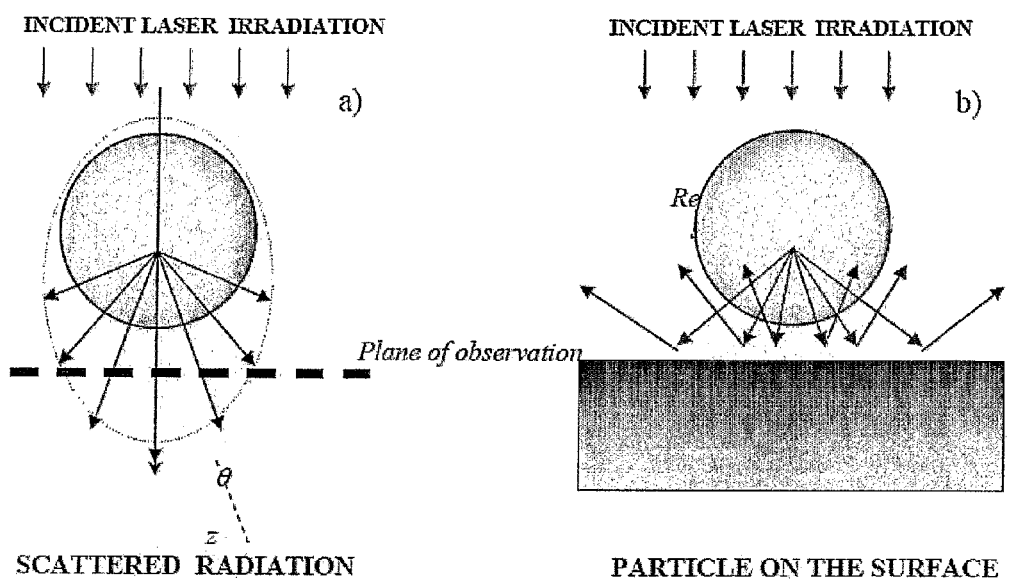
FIG. 2 is two schematic illustrations of particle scattering.
Figure 3A:
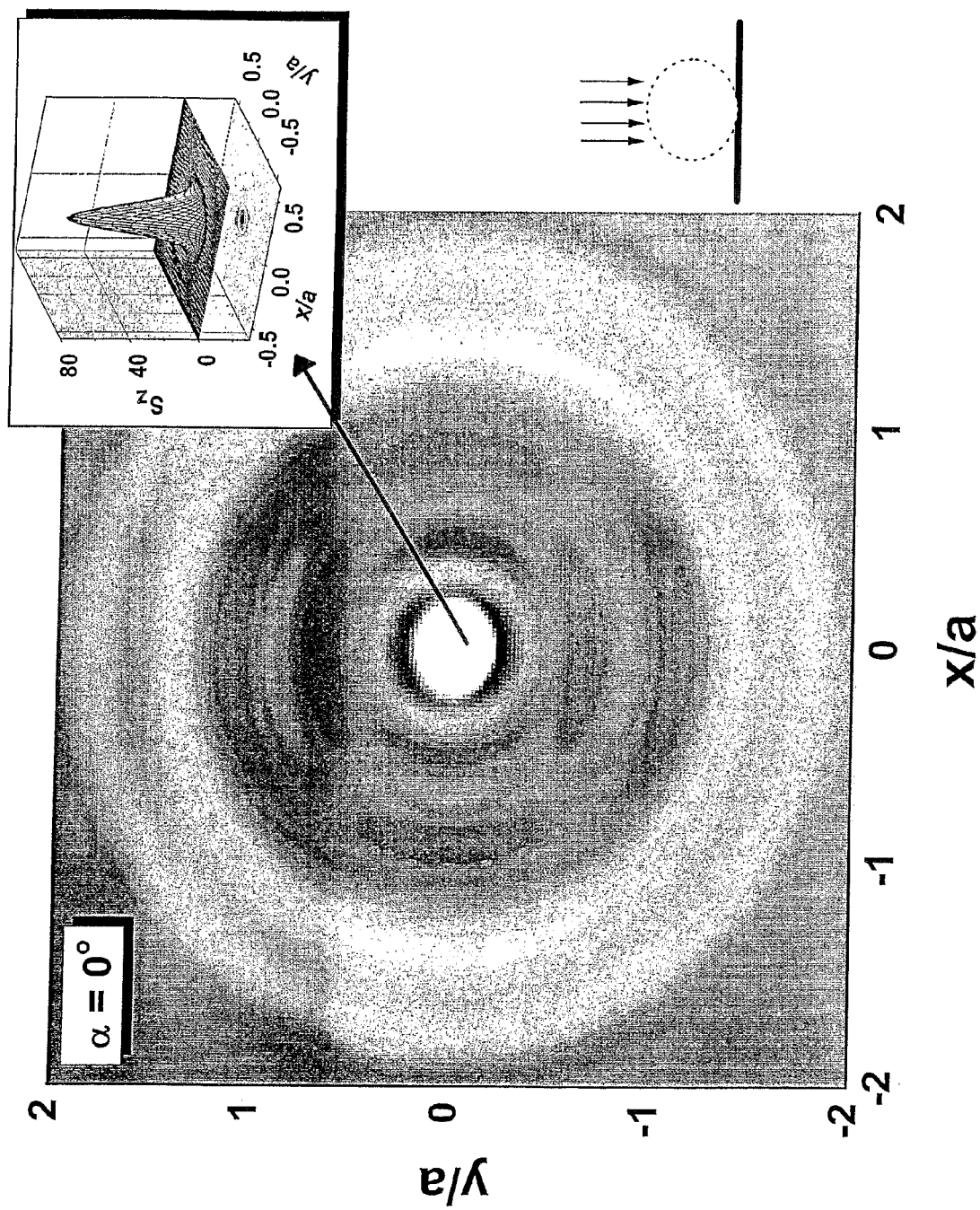
FIG. 3 is four examples of field intensity distribution.
Figure 3B:
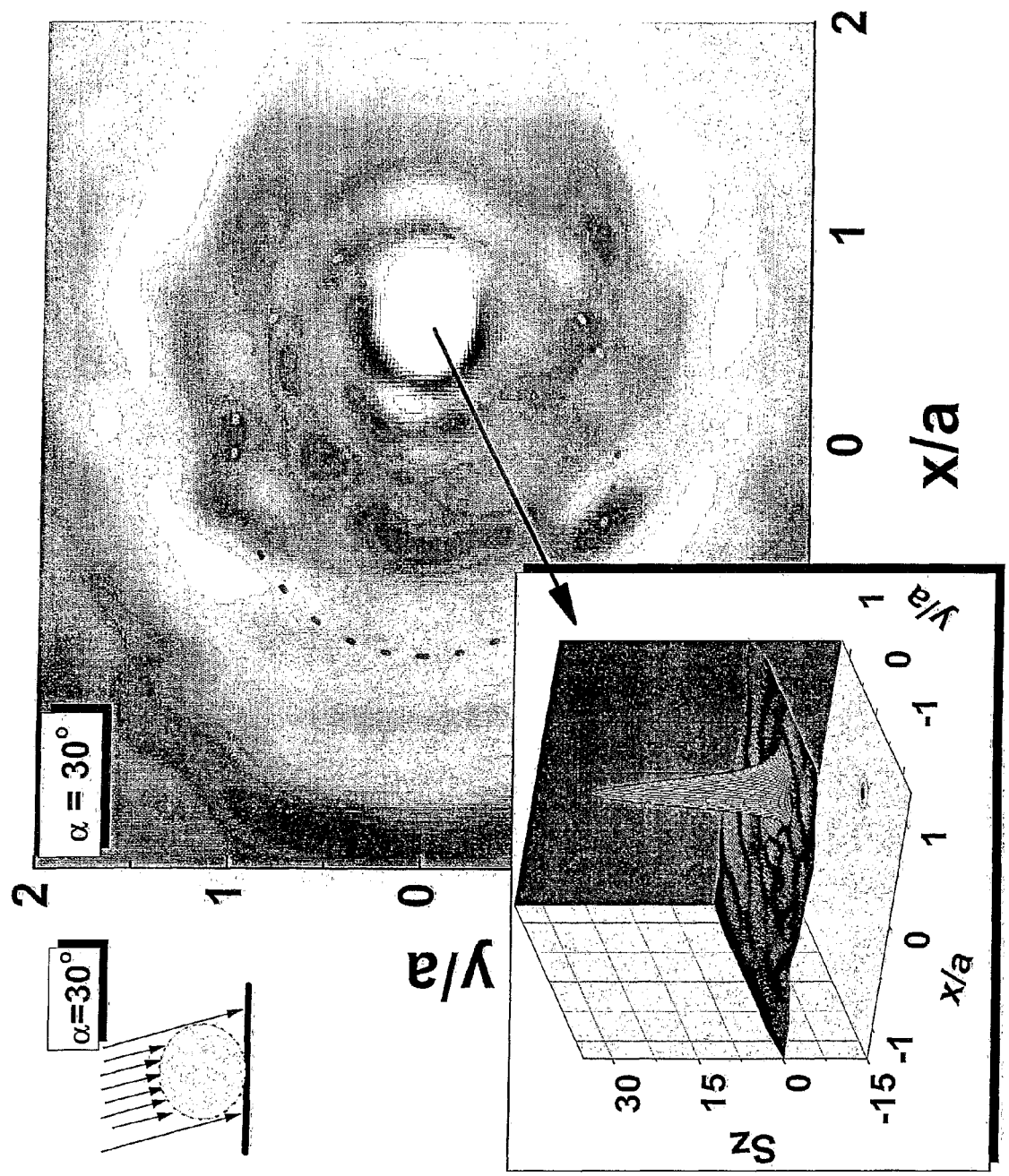
Figure 3C:
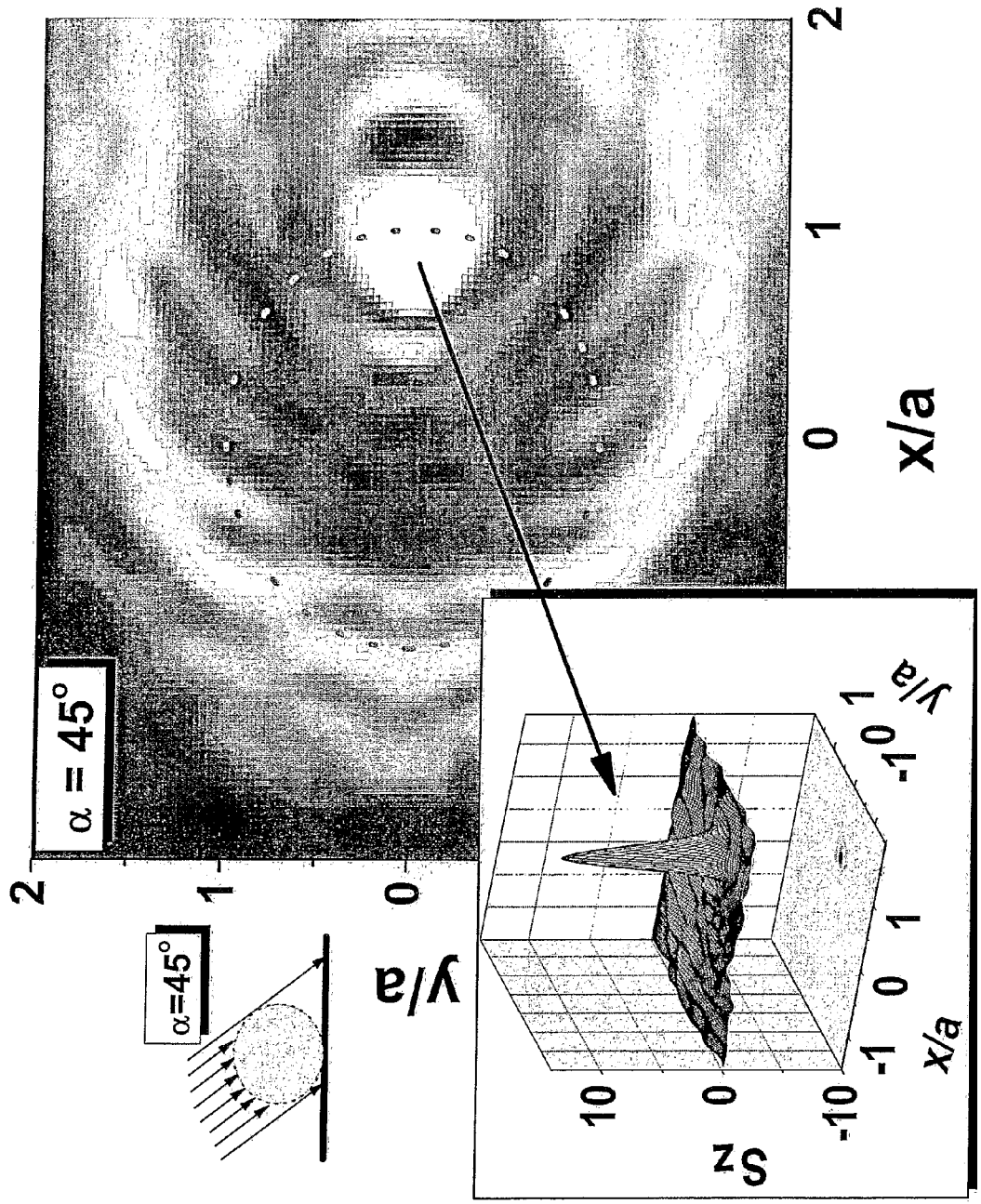
Figure 3D:
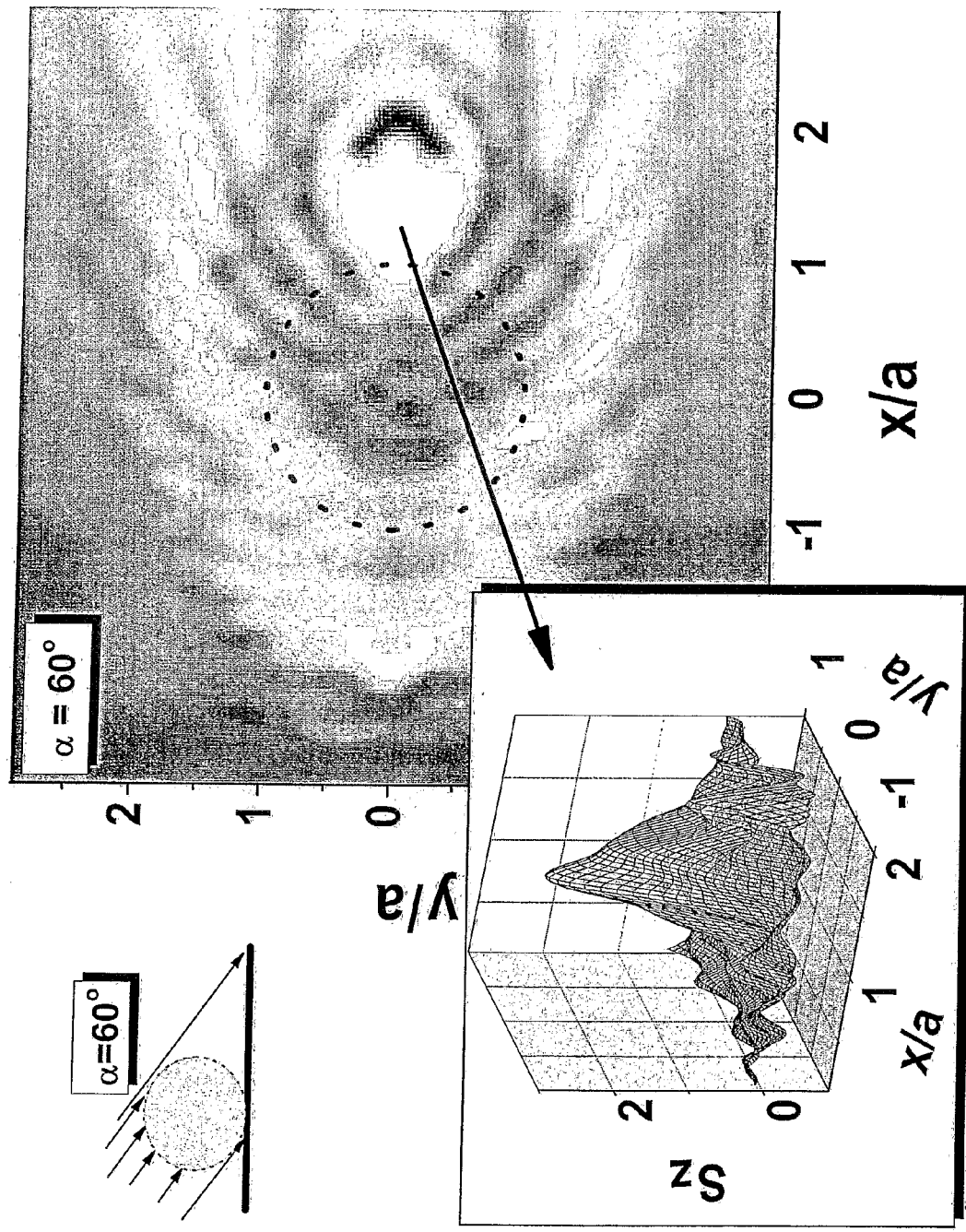

As shown in FIG. 2 when the particle is situated on a surface, the scattered radiation is further reflected and this reflected radiation produces the secondary scattering.

Schematics for the particle scattering are within the Mie theory, where the distribution of the field is studied at arbitrary points, such as, for example, in an observation plane. Secondary, the Mie theory, the incident plane wave propagates along the z-coordinate, and an electric vector is directed along the x-coordinate. With the particle on the surface—(b)—the scattered radiation reflects from the surface and participates in the secondary scattering.

Similar to the Mie theory the "particle on surface" provides an exact solution of the Maxwell equations. With this solution the additional scattered field $W^S$ can be expressed through the incident and reflected fields by the equation $$W^S = (1 - \hat{B}\hat{A})^{-1} \cdot \hat{B} \cdot (V^{in} + V^R), \quad (16)$$

where $\hat{B}$ represents a matrix expressed through the Mie theory and $\hat{A}$ represents the "reflection matrix", which describes the scattering of the spherical wave from the surface. Calculating the inverse matrix $(1-\hat{B}\hat{A})^{-1}$ in the above equation one can find all scattered fields for particle on surface theory. The problem, however is that the reflection matrix is highly complicated. It contains the Weyl type integrals:

$$A_{l',m';\,l,m} = \qquad (17)$$

$$i^{l'-1} \sqrt{\frac{2l'+1}{l'(l'+1)}} (-1)^{m-1} \delta_{mm'} \int_0^{\pi/2 - i\infty} d\alpha \sin\alpha\, e^{2iq\cos\alpha} a^m_{l',f';\,l,f},$$

where elements under the integral are given by:

$$a^m_{l',e;\,l,e}(\alpha) = \qquad (18)$$
$$r_p(\cos\alpha)\tilde{V}^m_l(\cos\alpha) d^{l'}_{m,-}(\pi - \alpha) + r_s(\cos\alpha)\tilde{U}^m_l(\cos\alpha) d^{l'}_{m,+}(\pi - \alpha),$$

$$a^m_{l',h;\,l,e}(\alpha) = -i \left\{ \begin{array}{l} r_p(\cos\alpha)\tilde{V}^m_l(\cos\alpha) d^{l'}_{m,+}(\pi - \alpha) + \\ r_s(\cos\alpha)\tilde{U}^m_l(\cos\alpha) d^{l'}_{m,-}(\pi - \alpha) \end{array} \right\},$$

$$a^m_{l',e;\,l,h}(\alpha) = i \left\{ \begin{array}{l} r_p(\cos\alpha)\tilde{U}^m_l(\cos\alpha) d^{l'}_{m,-}(\pi - \alpha) + \\ r_s(\cos\alpha)\tilde{V}^m_l(\cos\alpha) d^{l'}_{m,+}(\pi - \alpha) \end{array} \right\},$$

$$a^m_{l',h;\,l,h}(\alpha) = $$
$$r_p(\cos\alpha)\tilde{U}^m_l(\cos\alpha) d^{l'}_{m,+}(\pi - \alpha) + r_s(\cos\alpha)\tilde{V}^m_l(\cos\alpha) d^{l'}_{m,-}(\pi - \alpha),$$

$$\tilde{U}^m_l = i^{1-l}\frac{l-1}{2} = \left\{ \begin{array}{l} \sqrt{\frac{(l+m-1)(l+m)}{(2l-1)(2l+1)}}\, \tilde{P}^{m-1}_{l-1} - \\ \sqrt{\frac{(l-m-1)(l-m)}{(2l+1)(2l-1)}}\, \tilde{P}^{m+1}_{l+1} \end{array} \right\} - \qquad (19)$$

$$i^{-1-l}\frac{l+2}{2}\left\{ \begin{array}{l} \sqrt{\frac{(l-m+1)(l+m+2)}{(2l+3)(2l+1)}}\, \tilde{P}^{m-1}_{l-1} + \\ \sqrt{\frac{(l-m+1)(l+m+2)}{(2l+3)(2l+1)}}\, \tilde{P}^{m+1}_{l+1} \end{array} \right\}$$

$$\tilde{V}^m_l = \frac{1}{2}i^{1-l}\left\{ \begin{array}{l} \sqrt{(l-m+1)(l+m)}\, \tilde{P}^{m-1}_l - \\ \sqrt{(l+m+1)(l-m)}\, \tilde{P}^{m+1}_l \end{array} \right\},$$

where sign tilda indicates the normalized Legendre functions $$\tilde{P}^m_l(\cos\alpha) = \sqrt{(2l+1)\frac{(l-m)!}{(l+m)!}}\, P^m_l(\cos\alpha).$$

The function $d_{m,m'}{}^l(\alpha)$ is defined as:

$$d^l_{m,m'}(\alpha) \equiv \sqrt{(l+m')!(l-m')!(l+m)!(l-m)!} \qquad (20)$$

$$\sum_k (-1)^k \frac{\left(\cos\frac{\alpha}{2}\right)^{2l+m'-m-2k}\left(\sin\frac{\alpha}{2}\right)^{m-m'+2k}}{(l-m-k)!(l+m'-k)!(k+m-m')!k!}$$

and indexes plus and minus indicate the symmetrical and antisymmetrical combinations $$d^{l'}_{m,-}(\pi - \alpha) = \frac{1}{2}\{d^{l'}_{m,1}(\pi - \alpha) - d^{l'}_{m,-1}(\pi - \alpha)\}, \qquad (21)$$

$$d^{l'}_{m,+}(\pi - \alpha) = \frac{1}{2}\{d^{l'}_{m,1}(\pi - \alpha) + d^{l'}_{m,-1}(\pi - \alpha)\}$$

The $r_p(\cos\alpha)$ and $r_s(\cos\alpha)$ functions in (18) present the Fresnel reflection coefficients for parallel and perpendicular polarization. Coefficients d arise due to a rotation matrix. For each plane wave propagating in a direction other than the z-direction the basic Mie solution must be expressed in a rotated coordinate system $(r,\theta',\phi')$ in terms of those in the coordinate system $(r,\theta,\phi)$, i.e. transform the spherical harmonics. This transformation may be done with the help of an addition theorem for Legender polynomials, which yields:

$$Y^{m'}_l(\theta', \varphi') = \sum_{m=-l}^{l} (-1)^{m-m'} D^l_{m,m'}(\beta, \alpha, \gamma) Y^m_l(\theta, \varphi), \qquad (22)$$

$$D^l_{m,m'}(\beta, \alpha, \gamma) = e^{-im\beta} d^l_{m,m'}(\alpha) e^{-im'\gamma}.$$

Here rotation matrix D is expressed through the Euler angles $(\alpha,\beta,\gamma)$ arising during rotation of $(r,\theta,\phi)$ system to obtain the $(r,\theta',\phi')$ system. The argument $\pi-\alpha$ in formulae (18) and (21) expresses the angle of reflected light. Indexes f and f' in (17) indicate transitions between the electrical, f=e, and magnetic, f=h, components.

If the incident wave vector k is in the x-z plane of the coordinate system then $k=k(\sin\theta_i, 0, \cos\theta_i)$, where k is the absolute value of the wave-vector, $\theta_i$ is the incident angle, and amplitude $|E|=1$. If the plane wave is p-polarized (electric vector in the plane of incidence i.e. x-z plane), $V^{in}$ and $V^R$ have components:

$$^e V^{in}_l = \frac{i^{l-1}}{k}\sqrt{\frac{2l+1}{l(l+1)}}(-1)^{m-1} d^l_{m,-}(\theta_i), \qquad (23)$$

$$^h V^{in}_l = \frac{i^l}{k}\sqrt{\frac{2l+1}{l(l+1)}}(-1)^{m-1} d^l_{m,+}(\theta_i)$$

$$^e V^R_l = -\frac{i^{l-1}}{k}e^{2iq\cos\theta_i} r_p(\cos\theta_i)\sqrt{\frac{2l+1}{l(l+1)}}(-1)^l d^l_{m,-}(\theta_i),$$

$$^h V^R_l = -\frac{i^l}{k}e^{2iq\cos\theta_i} r_p(\cos\theta_i)\sqrt{\frac{2l+1}{l(l+1)}}(-1)^{l-1} d^l_{m,+}(\theta_i).$$

If it is s-polarized (electric vector normal to the plane of incidence) $V^{in}$ and $V^R$ have following components:

$$^e V^{in}_l = -\frac{i^l}{k}\sqrt{\frac{2l+1}{l(l+1)}}(-1)^{m-1} d^l_{m,+}(\theta_i), \qquad (24)$$

$$^h V^{in}_l = \frac{i^{l+1}}{k}\sqrt{\frac{2l+1}{l(l+1)}}(-1)^{m-1} d^l_{m,-}(\theta_i),$$

$$^e V^R_l = -\frac{i^l}{k}e^{2iq\cos\vartheta_i} r_s(\cos\theta_i)\sqrt{\frac{2l+1}{l(l+1)}}(-1)^{l-1} d^l_{m,+}(\theta_i),$$

$$^h V^R_l = -\frac{i^{l+1}}{k}e^{2iq\cos\vartheta_i} r_s(\cos\theta_i)\sqrt{\frac{2l+1}{l(l+1)}}(-1)^l d^l_{m,-}(\theta_i).$$

With the incident, reflected and scattered waves available, the Debye potential in respect to the total electromagnetic field (which is necessary for calculation of Poynting vector), can be expressed through calculated values. Differentiation of Debye potentials yields all electric and magnetic fields.

The matrix elements of $\hat{A}$ have to be calculated only for non-negative m values, the negative parts can be mirrored as:

$$a_{l',e;l,e}^{-m} = a_{l',e;l,e}^{m}, \; a_{l',h;l,e}^{-m} = -a_{l',h;l,e}^{m}, \; a_{l',e;l,h}^{-m} = -a_{l',e;l,h}^{m}, \; a_{l',h;l,h}^{-m} = a_{l',h;l,h}^{m}. \quad (25)$$

The integrand in Eq. (17) contains a highly oscillating function. For typical determinations it is insufficient to use the Laguerre polynomial approximation method. Thus, the "honest" integration in (17) is used. The integration contour is constructed as:

$$\alpha = \frac{\pi}{2}\frac{cx}{1+cx} + icx, \quad (26)$$

where c is any positive real value, and x varies from zero to infinity. Along this integration contour, a stable value can be achieved.

The numerical evaluation of the optical fields is mainly applied to the far-field scattering problems. In the far field, theoretical formula can be significantly simplified due to the fact that radial components ($E_r$, $H_r$) of these fields tend to zero. However, in the optical near field, the radial component is comparable to the angular components and thus cannot be neglected. Due to the presence of radial components, the reflected scattering wave $V^{SR}$ in the near field cannot be evaluated by known methods. However, the total field in the optical near field can be determined by constructing the total Debye potentials. Equivalence can be found: v→V, l→l)

$$^{f}D(r,\theta,\phi) = \quad (27)$$
$$\sum_{l=1}^{\infty}\sum_{m=-l}^{l}\{[^{f}(V_l^m)^I + {^f(V_l^m)^{IR}} + {^f(V_l^m)^{SR}}]j_l(kr) + {^f(W_l^m)^S}h_l^{(1)}(kr)\}$$
$$Y_l^m(\theta,\phi)$$

where $j_l(kr)$ and $h_l^{(1)}(kr)$ are spherical Bessel and Hankel functions of order l respectively. The index f in Eq. (27) can be $e(^eD)$ or $h(^hD)$, representing the electric Debye potential and magnetic Debye potential respectively. To determine $^f(V_l^m)^{SR}$ matrix Eq. (16) is rewritten into:

$$^{e}(W_l^m)^S = B_{l',m',e;l,m,e}(^eV_l^m - A_{l',m',h;l,m,h}B_{l',m',h;l,m,h}{^eV_l^m} + A_{l',m',e;l,m,h}B_{l',m',h;l,m,h}{^hV_l^m})/G_{l',m';l,m} \quad (28.a)$$

$$^{h}(W_l^m)^S = B_{l',m',h;l,m,h}(A_{l',m',h;l,m,e}B_{l',m',e;l,m,e}{^eV_l^m} - A_{l',m',e;l,m,e}B_{l',m',e;l,m,e}{^hV_l^m} + {^hV_l^m})/G_{l',m';l,m} \quad (28.b)$$

where $$G_{l',m';l,m} = 1 - \left( \begin{array}{c} A_{l',m',h;l,m,h} + \\ A_{l',m',e;l,m,h}A_{l',m',h;l,m,e}B_{l',m',e;l,m,e} \end{array} \right) B_{l',m',h;l,m,h} + \quad (28.c)$$

$$A_{l',m',e;l,m,e}B_{l',m',e;l,m,e}(A_{l',m',h;l,m,h}B_{l',m',h;l,m,h} - 1)$$

and $$^{e}V_l^m = {^e(V_l^m)^I} + {^e(V_l^m)^{IR}}, \; ^{h}V_l^m = {^h(V_l^m)^I} + {^h(V_l^m)^{IR}} \quad (28.d)$$

Such reformation is beneficial for programming and more efficient for calculation speed since it does not involve the further operation of matrix inversion. After the $^SW$ matrix is obtained, the $^f(V_l^m)^{SR}$ matrix is determined by:

$$^{f}(V_l^m)^{SR} = \frac{^f(W_l^m)^S}{^fB_l^m} - {^f(V_l^m)^I} - {^f(V_l^m)^{IR}} \quad (29)$$

Since $^f(W_l^m)^S$ matrix has a simplified form (l',m' orders are limited to l'=l, m'=m) due to the presence of KroneckDelta functions $\delta_{l,l'}, \delta_{m,m'}$ in the B matrix, there is no requirement to calculate all possible orders of (l,m) and (l',m'). Applying this method, Eq. (27) can be simplified as:

$$^{f}D(r,\theta,\phi) = \quad (30)$$
$$\sum_{l=1}^{\infty}\sum_{m=-l}^{l}\{[^{f}(W_l^m)^S/{^f(B_l^m)}]j_l(kr) + {^f(W_l^m)^S}h_l^{(1)}(kr)\}Y_l^m(\theta,\phi)$$

Finally, the total electric and magnetic field components (spherical coordinate (r,θ,φ)) can be calculated from the scalar Debye potentials by:

$$E_r = \frac{\partial^2[r(^eD)]}{\partial r^2} + k^2 r(^eD) \quad (31.a)$$

$$E_\theta = \frac{1}{r}\frac{\partial^2[r(^eD)]}{\partial r\partial\theta} + k_2\frac{1}{r\sin\theta}\frac{\partial[r(^hD)]}{\partial\phi} \quad (31.b)$$

$$E_\phi = \frac{1}{r\sin\theta}\frac{\partial^2[r(^eD)]}{\partial r\partial\phi} - k_2\frac{1}{r}\frac{\partial[r(^hD)]}{\partial\theta} \quad (31.c)$$

$$H_r = \frac{\partial^2[r(^hD)]}{\partial r^2} + k^2 r(^hD) \quad (31.d)$$

$$H_\theta = \frac{1}{r}\frac{\partial^2[r(^hD)]}{\partial r\partial\theta} - k_1\frac{1}{r\sin\theta}\frac{\partial[r(^eD)]}{\partial\phi} \quad (31.e)$$

$$H_\phi = \frac{1}{r\sin\theta}\frac{\partial^2[r(^hD)]}{\partial r\partial\phi} - k_1\frac{1}{r}\frac{\partial[r(^eD)]}{\partial\theta} \quad (31.f)$$

FIG. 3 shows four examples of intensity distribution for under 1.0 μm Polystyrene particles on GeSbTe substrate (GST-film) at different radiation incidence angles of (a) α=0°, (b) α=30°, (c) α=45° and (d) α=60° respectively. The white color represents the areas where the intensity field exceeds the material melting threshold. Thus, with incident radiation the chain of holes should be formed around the region of geometrical shadow.

Figure 4:
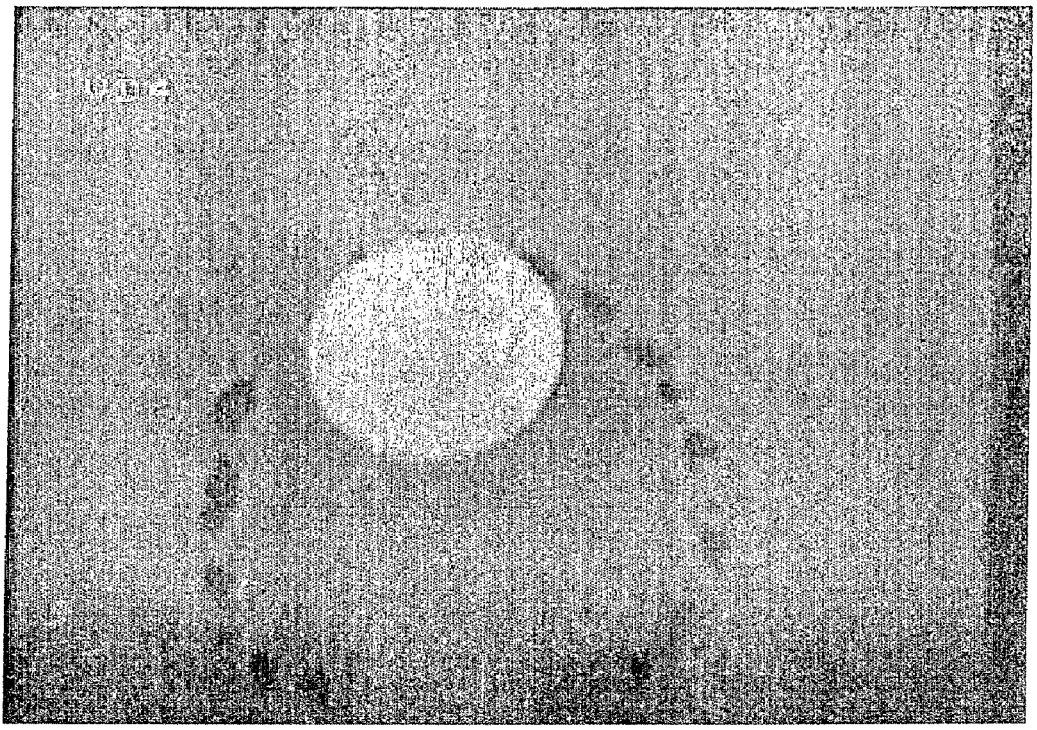
FIG. 4 is two SEM images of patterns formed on a GST film.
Figure 4:
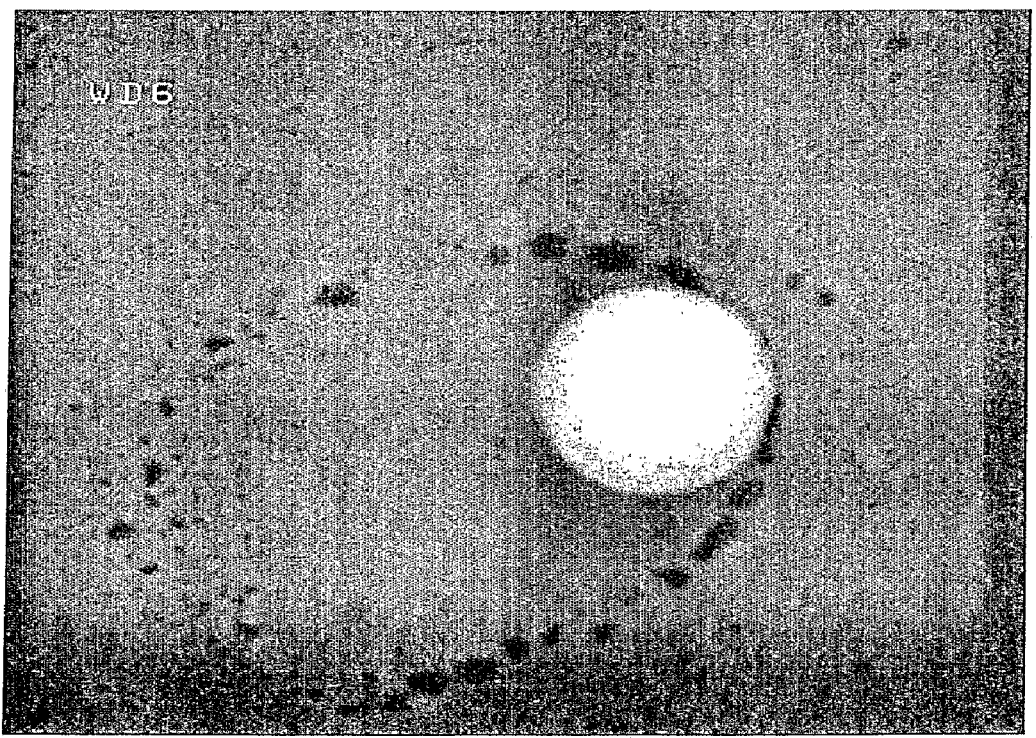

FIG. 4 shows two SEM images of patterns formed on GST film around un-removed particles at different angles and laser fluences, (a) α=45°, (b) α=60°.

From FIG. 4, it can be observed that comet-shape ring patterns are formed around the unremoved particles at 45° and 60° incidences. The particles are at the lobe of the patterns instead of the centers. The patterns are not linked together with some broken fine structures with a laser fluence of 7.5 mJ/cm². The absence of these higher-order rings in FIG. 4(a) is due to the insufficient intensity of these rings to induce the patterns on the substrate surface. The presence of neighboring particles affects the comet-shape ring patterns. For many particles in close proximity, the patterns can only be observed around the particles located the edges.

Figure 5:
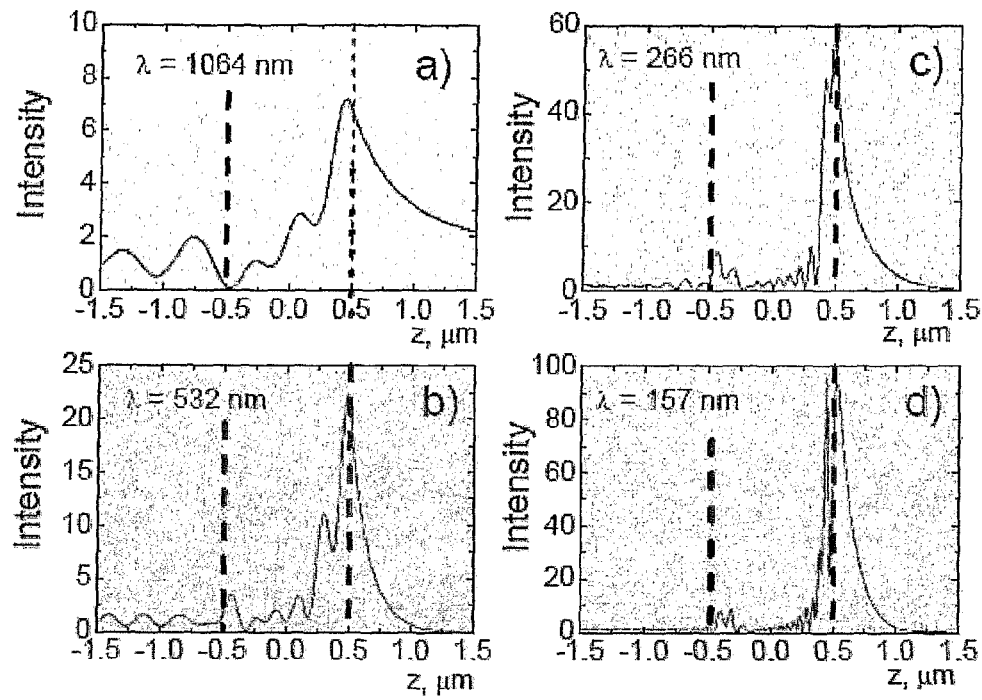
FIG. 5 is four graphs of intensity distributions.

FIG. 5 shows intensity distributions along the z-axis of 1 μm particle with refractive index n=1.6 for different radiation wavelengths.

Figure 6:
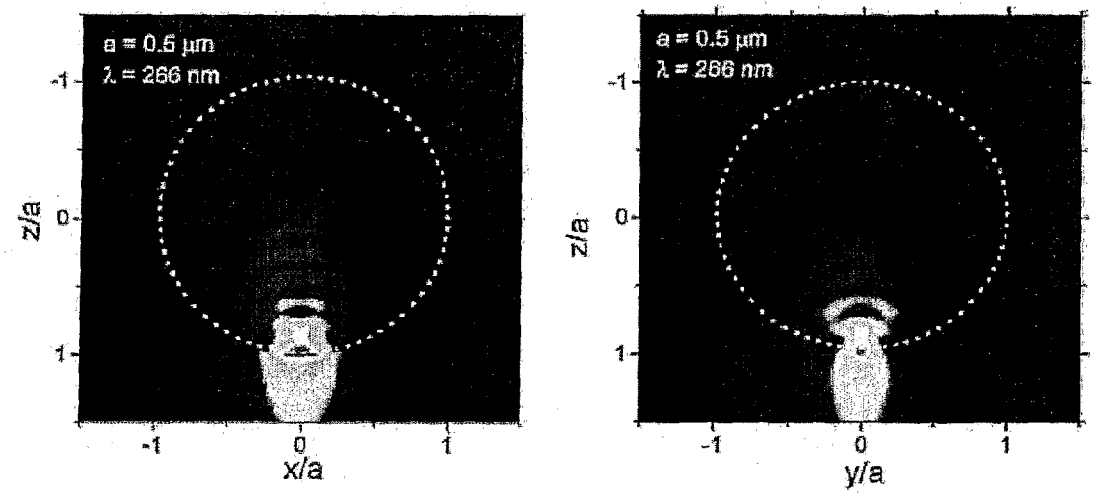
FIG. 6 is two contour plots of intensity distribution.

FIG. 6 shows two contour plots for intensity distribution inside and outside a 1 μm SiO$_2$ particle, illuminated by radiation with ?=266 nm, polarization parallel and perpendicular to image plane.

Figure 7:
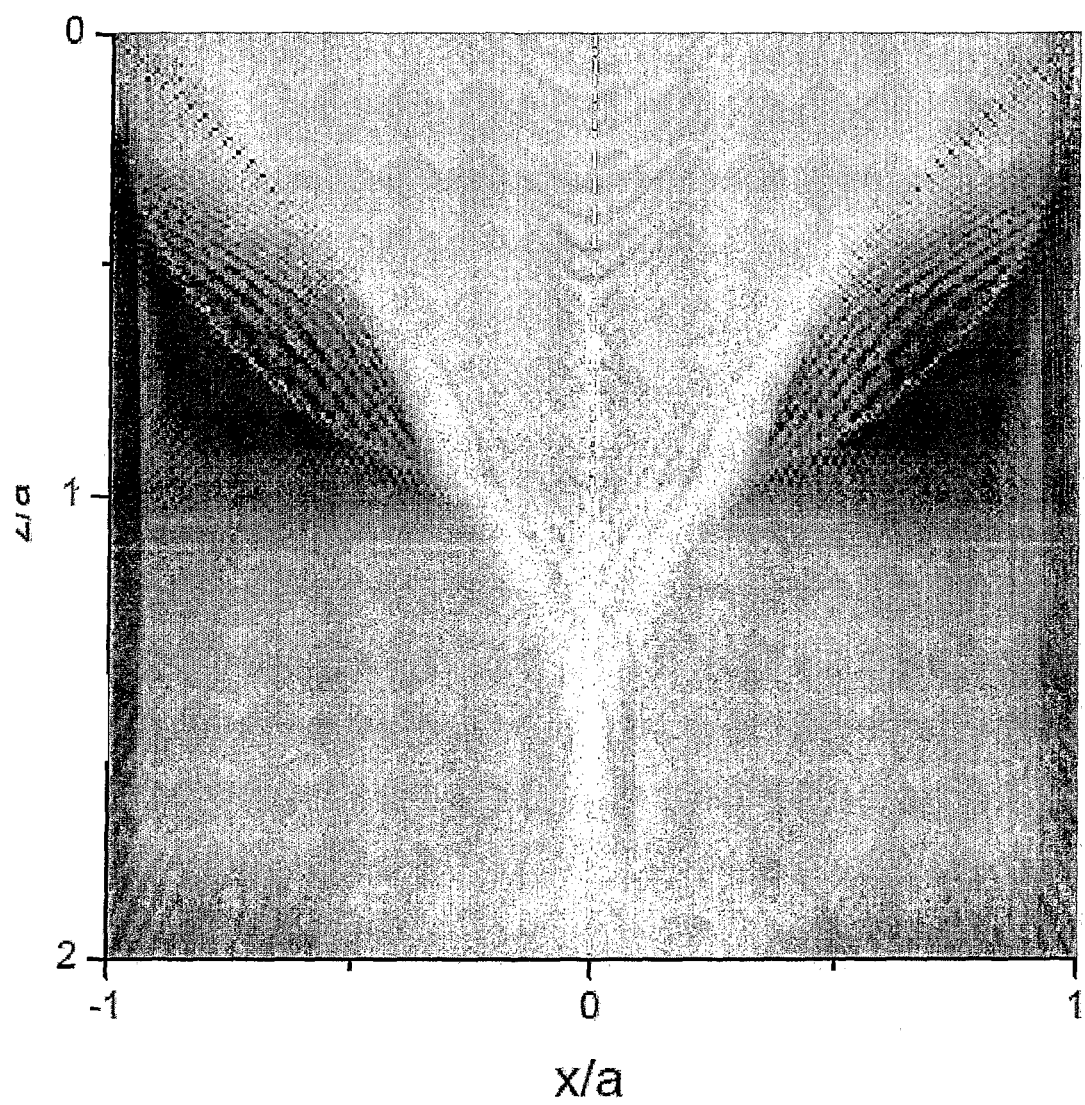
FIG. 7 is an SEM image showing field structure.

FIG. 7 shows the field structure near the output edge of a large particle (radius a=30?, n=1.41). There is axial caustic along the z-axis and multiple caustics below the particle edge, produced by Bessoid-type singularities.

Figure 8:
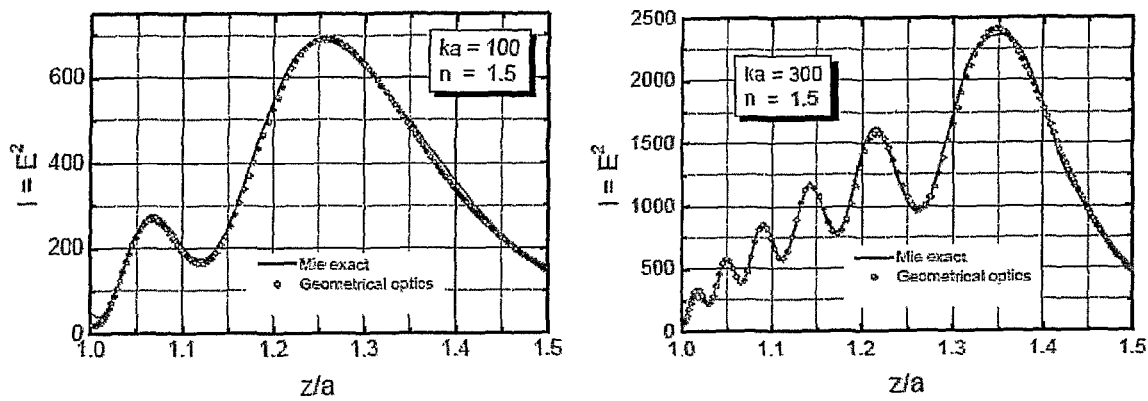
FIG. 8 is a companion of determinations.

FIG. 8 shows two comparisons of intensity distribution along z-axis with a large size parameter q=ka.

Whilst there has been described in the foregoing description preferred embodiments of the present invention, it will be understood by those skilled in the technology concerned that many variations or modifications in details of design or construction may be made without departing from the present invention.

Applications of the present invention may be in one or more of:

(a) bioimaging of small bio-objects such as, for example, a virus;
(b) laser nanopatterning with small micro/nano-particles;
(c) localized surface plasmon where light interacts with metallic particles; and
(d) apertureless NSOM where a particle is trapped by a laser beam.

The invention claimed is:

1. A method for determining exact field intensity in both near-field and far-field for a particle on a substrate in order to perform nanoscale operations, the method comprising:
   (a) providing an incident wave;
   (b) determining an electric vector of a field inside and outside the particle and a magnetic vector of the field inside and outside the particle;
   (c) determining an additional scattered field inside and outside of the particle due to reflection of the incident wave from the substrate;
   (d) determining the exact field intensity in both the near-field and the far-field in response to the electric vector and the magnetic vector of the field inside and outside the particle and the additional scattered field inside and outside the particle; and
   (e) performing the nanoscale operations in response to the exact field intensity.

2. The method as claimed in claim 1, further comprising determining a wave vector of radiation in the particle for determining the electric vector and the magnetic vector of the field inside and outside the particle and the additional scattered field inside and outside the particle.

3. The method as claimed in claim 1, further comprising transforming spherical harmonics for determining, the electric vector and the magnetic vector of the field inside and outside the particle and the additional scattered field inside and outside the particle.

4. The method as claimed in claim 1, further comprising determining extinction absorption and scattering for determining the electric vector and the magnetic vector of the field inside and outside the particle and the additional scattered field inside and outside the particle.

5. The method as claimed in claim 4, wherein the extinction absorption comprises integral characteristics caused by far-field scattering.

6. The method as claimed in claim 1, further comprising taking into account Fresnel reflection coefficients for parallel and perpendicular polarization for determining the electric vector and the magnetic vector of the field inside and outside the particle and the additional scattered field inside and outside the particle.

7. The method as claimed in claim 1, wherein the field is at least one selected from the group consisting of an electromagnetic field, an electric field and a magnetic field.

8. The method as claimed in claim 1, wherein the incident wave is a laser beam.

9. The method as claimed in claim 1, wherein a total field distribution is obtained by constructing a total Debye potential field.

10. The method as claimed in claim 1, wherein the field distribution is at least one selected from the group consisting of: electric field distribution, magnetic field distribution, Poynting vector field distribution, and other electromagnetic field distribution quantities which can be derived from the electric vector field and the magnetic vector field.

11. The method as claimed in claim 1, wherein the nanoscale operations are selected from the group consisting of forming nanostructures, performing surface modifications at the nanoscale, bio-imaging of nanoscale bio-objects, laser nanopatterning, localized surface plasmon, and apertureless near-field scanning optical microscopy (NSOM).

12. The method as claimed in claim 11, wherein the bio-imaging of nanoscale bio-objects comprises the bio-imaging of a virus.

13. The method as claimed in claim 11, wherein the laser nanopatterning comprises laser nanopatterning with small nano particles.

14. The method as claimed in claim 11, wherein the localized surface plasmon comprises localized surface plasmon where light interacts with metallic particles.

15. The method as claimed in claim 11, wherein the apertureless NSOM comprises apertureless NSOM where a particle is trapped by a laser beam.

16. A method for rapidly determining field distributions in both near-field and far-field for a particle on a substrate in order to perform nanoscale operations, the method comprising:
   (a) performing transformation of scattered field formulation $W^S$;
   (b) constructing a total Debye potential field in response, to the transformation;
   (c) determining the field distributions in both the near-field and the far-field in response to the total Debye potential field; and
   (d) performing the nanoscale operations in response to the field distributions.

17. The method as claimed in claim 16, wherein the transformation of the scattered field formulation removes a matrix inversion operation in determining a Weyl-type reflection matrix.

18. The method as claimed in claim 16, wherein the transformation of the scattered field formulation reduces field summation orders and improves field convergence.

19. The method as claimed in claim 16, wherein the total Debye potential is a scalar potential calculated by summing Debye potentials of incident, scattered and reflection fields.

20. The method as claimed in claim 16, wherein the field distributions are vector fields that can be determined from Debye potentials.

21. The method as claimed in claim 16, wherein the nanoscale operations are selected from the group consisting of forming nanostructures, performing surface modifications at the nanoscale, bio-imaging of nanoscale bio-objects, laser nanopatterning, localized surface plasmon, and apertureless near-field scanning optical microscopy (NSOM).

* * * * *